219-121
6/8/82     OR    4,334,139        SR

United States Patent [19]
Wittekoek et al.

[11] 4,334,139
[45] Jun. 8, 1982

[54] APPARATUS FOR WRITING PATTERNS IN A LAYER ON A SUBSTRATE BY MEANS OF A BEAM OF ELECTRICALLY CHARGED PARTICLES

[75] Inventors: Stefan Wittekoek; Theodorus A. Fahner, both of Eindhoven, Netherlands

[73] Assignee: U.S. Philips Corporation, New York, N.Y.

[21] Appl. No.: 157,993

[22] Filed: Jun. 9, 1980

[30] Foreign Application Priority Data

Jun. 12, 1979 [NL] Netherlands ............... 7904580

[51] Int. Cl.$^3$ .............................................. B23K 15/00
[52] U.S. Cl. ..................... 219/121 EW; 219/121 EJ; 219/121 LX; 250/492.3
[58] Field of Search ................. 219/121 EB, 121 EH, 219/121 EJ, 121 EK, 121 EM, 121 ES, 121 EU, 121 EW, 121 EX, 121 EY, 121 LJ, 121 LK, 121 LR, 121 LS, 124.02, 121 LX; 250/492.3

[56] References Cited

U.S. PATENT DOCUMENTS

3,291,959  12/1966  Schleich et al. .............. 219/121 ES
3,648,048  3/1972  Cahan et al. .............. 219/121 EY X
3,902,036  8/1975  Zaleckas ...................... 219/121 LS
4,145,597  3/1979  Yasuda ..................... 219/121 EW X

FOREIGN PATENT DOCUMENTS

2656730  6/1978  Fed. Rep. of Germany .
54-74197  6/1977  Japan .............................. 219/121 LR
913504  12/1962  United Kingdom ......... 219/121 EB
192001  3/1967  U.S.S.R. .......................... 219/124.02

OTHER PUBLICATIONS

*IEEE Transactions on Electron Devices,* vol. ED-22, No. 7, Jul. 1975, pp. 376–384, "An Electron Beam Maskmaker", by Beasley et al.
*Laser Focus;* Mar. 1976, pp. 38–40; "Lateral-Effect Photodiodes", by Brian O. Kelly.
Proceedings of the Society of Photo-Optical Instrumentation Engineers, vol. 221, *Semiconductor Microlithography V;* Mar. 17–18, 1980, pp. 2–8; "Step and Repeat Wafer Imaging", by S. Wittekoek.

*Primary Examiner*—J. V. Truhe
*Assistant Examiner*—Keith E. George
*Attorney, Agent, or Firm*—Robert J. Kraus

[57] ABSTRACT

An apparatus is described for writing patterns in a layer on a substrate by using a beam of electrically-charged particles. The apparatus is provided with an optical height-measuring system for determining a deviation between the desired and the actual position of the surface to be inscribed relative to the charged particle lens system. The deviation can be measured accurately and continuously without the use of additional markers on the substrate.

7 Claims, 4 Drawing Figures

APPARATUS FOR WRITING PATTERNS IN A LAYER ON A SUBSTRATE BY MEANS OF A BEAM OF ELECTRICALLY CHARGED PARTICLES

BACKGROUND OF THE INVENTION

The invention relates to an apparatus for writing patterns in a layer on a substrate by means of a beam of electrically charged particles, comprising a source for generating the beam, a charged-particle lens system for focussing the beam on the layer, and means for moving the beam and the substrate relative to each other in directions transverse to the beam axis.

Such apparatus may for example be used to expose certain areas of a layer of electron-sensitive resist to an electron beam, so that either these areas or the rest of the layer may subsequently be etched away. Other applications are the removal of selected areas on a metal layer, or ion-implantation in selected areas of a semiconductor layer. This type of technique is for example employed in the manufacture of so-called micro-circuits. These micro-circuits may be magnetic-domain memories ("bubble memories") or integrated electronic circuits (hereinafter abbreviated I.C., from "integrated circuit"). The resolution that can be achieved with a beam of charged particles, which is generally an electron beam but may alternatively be an ion beam, is greater than the resolution that can be achieved when a beam of electromagnetic radiation, for example ultraviolet light, is used.

In the article: "An Electron Beam Maskmaker" in: I.E.E.E. Transactions on Electron Devices", Vol. ED-22, No. 7, July 1975, pages 376–384, a so-called "electron beam writer" is described, i.e. a device in which a layer of a substrate is exposed to an electron beam in accordance with a specific pattern. By means of such a device microcircuit masks can be manufactured, with the aid of which masks the desired I.C. patterns of magnetic-domain patterns can be projected on a layer of a substrate, such as a slice of silicon. Alternatively, such a writer enables microcircuit patterns to be written directly into the layer.

Apart from the higher resolution, the use of an electron beam in comparison with the use of an optical beam in the manufacture of microcircuits, has some further advantages, namely a greater flexibility and the possibility of writing extensive patterns with very small details. In the case of direct writing in the layer on the substrate of the microcircuits with a charged-particle beam, a number of steps in the manufacturing process can be avoided, so that the risk of errors is reduced.

In a device for writing with a beam of charged particles the beam should be positioned very accurately on the layer to be inscribed. This positioning is effected by adjusting the angle $\phi$ between the beam and the axis of the charged-particle lens system. In order to obtain the desired positioning accuracy, the height of the layer to be inscribed relative to the lens system would have to remain constant with great accuracy. It has been found that in practice there are always variations in the height because of inaccuracies in the mechanical guidance of the substrate relative to the lens system, unevenesses of the substrate, and replacement of the substrate in the writing apparatus after the substrate has been removed therefrom for the performance of lithographic process steps. Therefore, it is necessary that the position of the layer to be inscribed relative to the lens system be measured, so as to enable the deflection angle $\phi$ to be adjusted on the basis of the measurement.

As is described in the article "An Electron Beam Maskmaker", additional markers may be provided on the substrate for this purpose, for example in the form of small squares of a heavy metal such as gold. Before the desired pattern is written the markers are scanned by the beam and the electron backscatter on the markers is measured. Thus the actual positions of the markers can be determined, so that the deviations in the height of the layer to be inscribed and the positioning of the beam are known for areas around the markers. This height measurement has the disadvantages that additional process steps are necessary, namely depositing the markers on the substrate and scanning the substrate before inscribing, and that by providing the markers the electrical behavior of the semiconductor circuit to be manufactured may be affected.

It could also be considered to make the charged-particle lens system telecentric, i.e. to add an extra lens to this system, so that for any position in the layer to be inscribed the angle $\phi$ between the beam and the axis of the lens system becomes zero. The addition of an extra lens, however, complicates the writing apparatus. Making the lens system telecentric moreover means that a compromise must be made with respect to certain parameters of this system, such as the image field or the angle of aperture.

SUMMARY OF THE INVENTION

It is an object of the present invention to provide an apparatus for writing with charged particles in which the position of the layer to be inscribed relative to the lens system is measured continuously during the actual writing operation, without requiring the use of additional markers on the substrate. An apparatus in accordance with the invention is therefore characterized by an optical height measuring system, for determining deviation between the desired and the actual position of the surface to be inscribed relative to the charge-particle lens system, which height measuring system comprises a radiation source which produces an optical beam, optical means for directing the optical beam to and for focussing this beam to a radiation spot on the surface, and for forming an image of the radiation spot in the plane of an optical radiation detection system, which is disposed on the same side of the layer to be inscribed as the optical radiation source. The output signal of the detection system is dependent on the position of the image of the radiation spot relative to said system.

The optical beam is incident on the substrate at a large angle of incidence and is reflected to the detector by said substrate. The beam is focussed in the plane which coincides with the desired position of the layer to be inscribed. In the case of a height variation of said layer the position of the image on the detection system will change.

It is to be noted that in optical imaging systems it is known to determine the position of a plane on which an image is to be formed with the aid of an optical auxiliary beam, which is reflected to a detection system by said plane. For this reference can be made to German patent application No. 2,656,730 which has been laid open to public inspection and which describes an apparatus for reading a record carrier with an optically readable trackshaped information circuit. A problem associated with this system is that the depth of focus of the read beam is very small, so that a change in position of the plane of the information structure is apt to result in a decrease of the modulation depth of the signal being read and in cross-talk between adjacent tracks. A change in position of the plane of the information structure will not lead to a change of the position of the read spot relative to the information structure. In an apparatus for writing with a charge-particle beam the depth of focus of this beam is very great, so that a change in position of the layer to be inscribed will not lead to a significant increase of the exposed area on the layer. However, said change in position does lead to a substantial displacement of the exposed area on the layer.

The use of an optical height measuring system in an apparatus for writing with a charged-particle beam is a considerable and non-obvious change to the concept of such an apparatus and has substantial advantages such as the possibility of a continuous height measurement which is performed during writing, no additional time being required for this measurement. This measurement demands no additional process steps and no additional markers, which may influence the behaviour of the microcircuit to be manufactured, need be provided.

The detection system of the optical height measuring system may be constituted by a so-called "duo cell" i.e. two photodiodes separated by a narrow gap. However, preferably a so-called "lateral effect diode" is employed as the detection system. Such a diode is described in the magazine "Laser Focus", March 1976, pages 38–40. The advantage of a lateral effect diode is that it provides positional information which is independent of the intensity distribution within the optical beam.

An apparatus in accordance with the invention may further be characterized by the inclusion, in the path of the optical beam which has been reflected a first time by the layer to be inscribed of a beam-inverting element which reflects this mirror-inverted beam along itself. The optical radiation detection system is included in the path of the optical beam which has been reflected a second time by the layer to be inscribed.

In this embodiment the positional error signal supplied by the detection system is independent of local differences in reflection of the layer to be inscribed. Moreover, the sensitivity to positional errors of said layer is twice as great as in the case where the optical beam is reflected only once by the layer before impinging on the detection system.

BRIEF DESCRIPTION OF THE DRAWING

The invention will now be explained by describing its use in an electron beam writer. For this reference is made to the drawing, in which.

Figure 1:
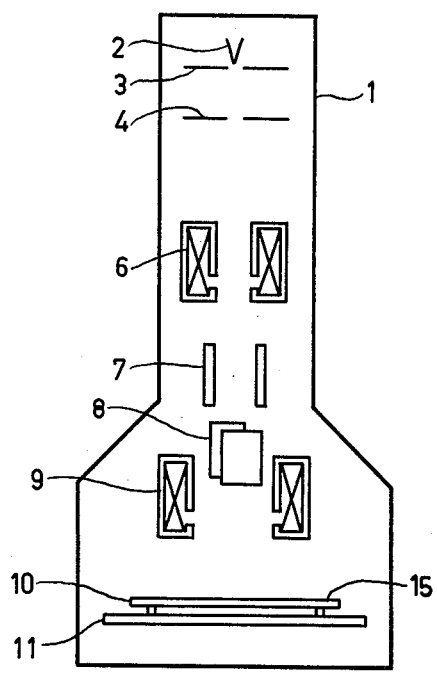
FIG. 1 shows a known electron beam writer.

The electron beam writer of FIG. 1 comprises an evacuated enclosure 1 which accommodates an electron gun 2, a control electrode 3, by which the electron beam is formed and accelerated, and an anode 4. The electron beam from the gun consecutively passes through a first electromagnetic focussing lens 6, x and y deflection plates 7 and 8, and a second electromagnetic focussing lens 9 and is subsequently incident on a substrate 10 which is provided with an inscribable layer 15 and which is arranged on a movable slide 11. If desired the deflection plates 7 and 8 may be replaced by electromagnetic deflection coils which may be arranged so that they produce smaller aberrations than electrostatic deflection plates.

Figure 2:
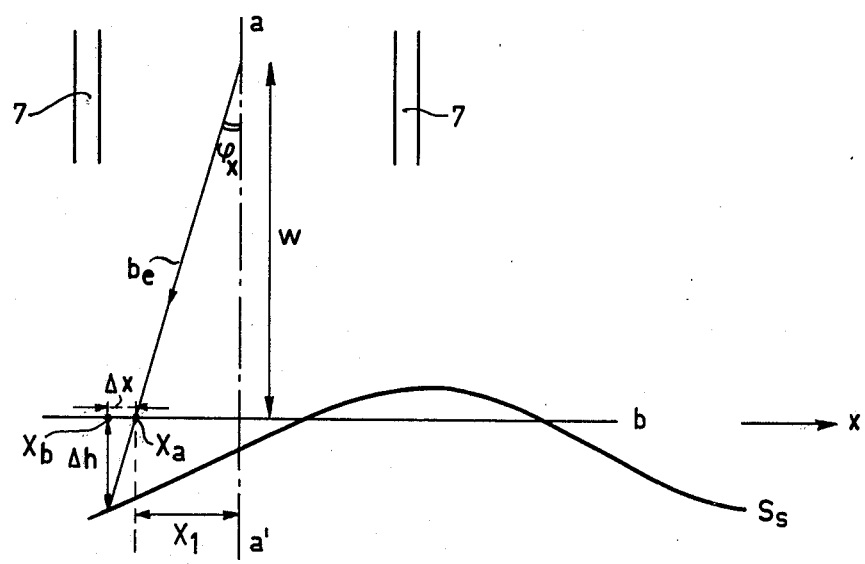
FIG. 2 illustrates how the electron beam is incident on the layer to be inscribed.

FIG. 2 shows how the electron beam $b_e$ is incident on the substrate surface $S_s$. In this Figure the deflection system for the x-direction is designated 7 and b is the image plane of the electron-optical lens system 6, 9. In order to position the electron beam at a point $X_a$ on the image plane at a distance $x_1$ from the axis aa' of the system, the deflection coils 7 are energized so that the beam $b_e$ makes an angle $\phi_x$ with the axis aa'. This distance satisfies the relationship $x_1 = w \cdot \tan \phi_{x'}$ where w is the so-called working distance of the electron-optical system. In practice the substrate surface will not always coincide exactly with the image plane b. In FIG. 2 the deviations between the surface $S_s$ and the image plane b have been exaggerated. The deviations may be the result of unevenesses of the substrate or of inaccuracies in the mechanical guidance of the substrate. If the height deviation of the substrate surface at the location of the point $X_a$ is $\Delta h$, the electron beam $b_e$ will not hit the substrate surface in the point $X_a$ but in a point $X_b$, which is situated at a distance $x_1 + \Delta x$ from the axis aa'. This results in a positional error $\Delta x$, which is given by: $\Delta x = \Delta h \cdot \tan \phi_x = \Delta h \cdot x_1 / W$. A similar positional error may occur in the Y direction. This error $\Delta y$ is given by:

$$\Delta y = \Delta h \cdot \tan \phi_y = \Delta h \cdot y_1 / W.$$

In practice it is required that $\Delta x$ is smaller than for example 0.1 μm for x = 2 mm and w = 40 mm this would mean that $\Delta h$ should remain smaller than 2 μm. This is virtually impossible because of the uneveness of the substrate. In accordance with the invention the height of the substrate surface at the location of the axis of the electron-optical system, which is always close to the point where the electron beam is incident, is therefore measured optically and continuously. The signal resulting from this measurement is applied to the beam deflector 7, so as to correct the angles $\phi_x$ and $\phi_y$ in such a way that $\Delta x = 0$ and $\Delta y = 0$.

Figure 3:
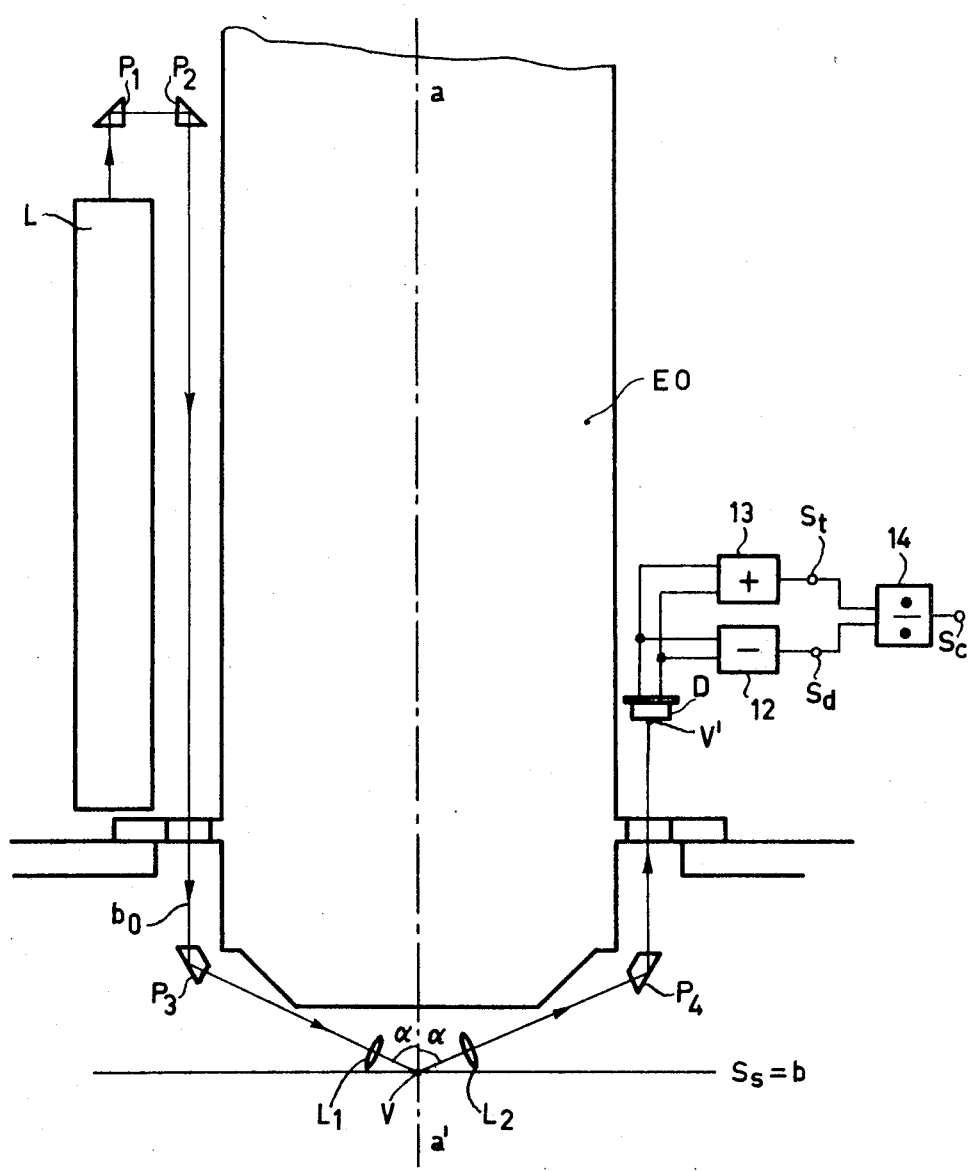
FIG. 3 shows a first embodiment of an apparatus in accordance with the invention.

FIG. 3 schematically represents an embodiment of an apparatus with an optical height measuring system.

In this figure the electron-optical system is represented by the block EO. The optical height measuring system is rigidly connected to the system EO and comprises a radiation source, for example a laser L. The optical beam $b_o$ produced by the laser, of which for the sake of simplicity only the chief ray is shown, is directed to the substrate surface $S_s$ via the prisms $P_1$, $P_2$ and $P_3$ and is incident on a substrate at an angle α. The beam $b_o$ is reflected by the substrate surface and is subsequently directed to an optical radiation detection system D by the prism $P_4$.

The radiation path from the laser to the substrate includes a lens $L_1$ which focusses the beam $b_o$ to radiation spot V in the image plane of the electron-optical system. The lens $L_2$ images the radiation spot V in the plane of the detection system D, for example a duo cell. The height measuring system has been aligned relative to the electron optical system in such a way that the lens $L_2$ images the intersection of the axis aa' of the electron-optical system with the image plane b of said system in the plane of the detection system D. If the substrate surface $S_s$ coincides with the plane b, the radiation spot V is imaged in the spot V', which is symmetrically disposed relative to the detection system D. Both halves of the detection system D then receive the same radiation intensity. The output signal $S_d$ of a differential amplifier 12, which is connected to the detection system output, is then for example zero. The deflection of the deflection system 7 then need not be corrected.

When the substrate surface is now displaced relative to the image plane b, the image V' is also shifted i.e. this image is no longer symmetrical relative to the detection system. For example, if the substrate surface has shifted downwards, the left-hand part of the detection system D will receive more radiation than the right-hand part of the detection system. In the case of a shift of the surface $S_s$ in an upward direction the reverse will occur.

As the lens $L_2$ forms an image of the radiation spot V on the detection system D, the signal $S_d$, in a first-order approximation, will not be influenced by tilting of the substrate.

The angle $\alpha$ at which the beam $b_o$ is incident on the substrate surface is selected as large as possible, for example of the order of 80°. The reflection on the substrate surface is then a maximum and the sensitivity of the measuring system, i.e. the shift if the image V' as a function of the shift of the substrate surface, is a maximum. This shift $\Delta s$ is given by:

$\Delta s = 2.\Delta h. M. \sin \alpha$ where M is the magnification of the lens $L_2$.

Preferably, a position-sensitive photodiode, a so-called lateral-effect photodiode, is selected as the detection system D. Such a photodiode is described in the magazine: "Laser Focus", March 1976, pages 38-40, and is not described herein in detail. When a lateral-effect photodiode is employed, the maximum displacement of the substrate surface that can be measured is twice as great as in the case where use is made of a duo cell having the same radiation-sensitive area as the lateral-effect photodiode.

The image V' of the radiation spot V may exhibit light and dark portions, which are for example caused by interference of portions of the beam $b_o$ which have been reflected by the surface of the resist layer to be inscribed, with portions of the beam $b_o$ which have passed through the transparent resist layer and have been reflected by the surface of the substrate disposed underneath it. If a duo cell is used this may give rise to inaccuracies in the height measurement. As the lateral-effect photo diode always measures the maximum of the light distribution within the image V', said light and dark portions will hardly affect the height measurement when such a photodiode is employed.

Whereas the apparatus in accordance with German Patent Specification No. 2,656,730, which has been laid open to public inspection, controls the height deviation $\Delta h$ to zero by correcting the distance between the optical lens system and the plane on which the image is to be formed, a writing apparatus in accordance with the invention employs the measured height-error signal to adapt the angles $\phi_x$ and $\phi_y$ and not to correct the distance between the electron-optical system and the layer to be inscribed. Steps must be taken to ensure that the signal used for correcting the angles $\phi_x$ and $\phi_y$ is solely dependent on the height deviation $\Delta h$ and is not influenced by variations in the intensity of the source or by variations in the transmission or the reflection of the optical elements in the radiation path.

For this purpose, as is shown in FIG. 3, the electronic circuit for processing the detector signal may not only include a differential amplifier 12 but also a summing amplifier 13 in which the signals from the detector halves are added. The outputs of the circuits 12 and 13 are connected to a divider circuit 14, in which the quotient $S_d/S_t$ is determined. The output signal $S_c = S_d/S_t$, which is employed for correcting the angles $\phi_x$ and $\phi_y$, is only dependent on the height error $\Delta h$.

The simultaneously filed Netherlands Patent Specification No. 7904579 (PHN 9487) which corresponds to U.S. application Ser. No. 158,653, describes an optical imaging system provided with a height measuring system for determining deviations in the image plane of the imaging system and a second plane on which an image is to be formed. In this measuring system an auxiliary beam, after reflection by the second plane, traverses a beam-inverting element, which reflects the mirror-inverted beam along itself, so that said beam is once more incident on the second plane, the beam portions being interchanged. The beam which has been reflected a second time by the second plane is incident on a position-sensitive detection system, for example a duo cell. In comparison with the height measuring system in which the auxiliary beam is reflected once by the second plane, a system in which the auxiliary beam is reflected twice by the second plane has the advantages that the sensitivity is doubled and that the height measurement is independent of local differences in reflection in the second plane.

Figure 4:
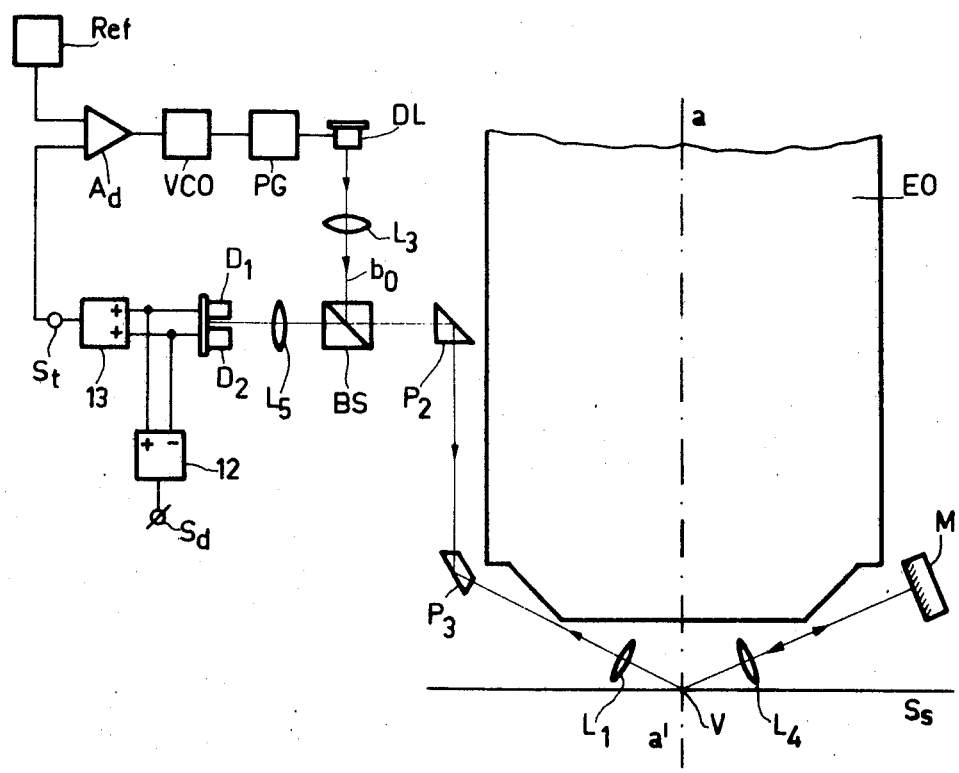
FIG. 4 shows a second embodiment of such an apparatus.

The optical height measuring system of an apparatus for writing a charged-particle beam may be modified in conformity with the height measuring system of Netherlands patent application No. 7904579 (PHN 9487), so that these advantages are obtained. FIG. 4 shows such an embodiment of the height-measuring system. The electron-optical system is again designated EO and the substrate surface $S_s$.

In order to ensure that for small displacements of the substrate surface $S_s$ a sufficiently large signal $S_d$ is obtained, i.e. a sufficiently great difference between the radiation intensities on the two detector halves, the radiation spot V should be bright. Therefore, a laser is preferred as radiation source. The radiation beam $b_o$ produced by the laser should be stable. Preferably, a semiconductor diode laser, DL in FIG. 4, for example an AlGaAs diode laser, is used, which can be placed close to the substrate. It is alternatively possible to employ a gas laser, which is disposed at a greater distance from the substrate, the radiation of said laser being passed to the substrate via a light-conducting fibre.

The laser beam $b_o$ is converted into a parallel beam by the lens $L_3$ and is subsequently directed to the substrate surface $S_s$ via reflection on a beam splitter BS, for example a semi-transparent prism, and the reflection prisms $P_2$ and $P_3$. The lens $L_1$ forms the radiation spot V on the substrate surface. After reflection on this surface the beam $b_o$ traverses a beam-inverting element. This element may comprise the lens $L_4$ and the mirror M, said mirror being disposed in the focal plane of the lens $L_4$. Such an inverting element reflects the beam along itself, the beam halves being interchanged. The beam $b_o$ subsequently traverses the same path in the reverse direction. A part of the beam which has been reflected twice by the substrate surface is transmitted by the beam splitter BS to the detection system D, which may again comprise a duo cell or a lateral-effect photodiode. The lens $L_5$ forms an image V" of the radiation spot V on the detection system. The detector signals are processed in a similar way as described with reference to FIG. 3. The two halves which are incident to the detection system have both cooperated with the left-hand and with the right-hand part of the substrate area at the location of the radiation spot V, so that the measuring signal is independent of local differences in reflection of the substrate.

The difference signal $S_d$ of the two detectors $D_1$ and $D_2$ is primarily determined by the distance between the image plane of the lens system EO and the plane $S_s$. However, this signal is also dependent on the total intensity of the auxiliary beam $b_o$ which has been reflected twice by the plane $S_s$. This intensity may vary as a result of a variation in the radiation-source intensity or as a result of variations in the reflection or transmission coefficients of the optical elements in the radiation path.

In order to eliminate the effect of variations in the total beam intensity which is incident on the detectors $D_1$ and $D_2$, the output signals of the detectors may be added yielding a sum signal $S_t$. In an analog divider circuit, as is shown in FIG. 3, the signal $S_c = S_d/S_t$ can then be derived, which signal is a measure of the positional error of the plane $S_s$ of the substrate relative to the projection lens system and which is independent of intensity variations of the radiation source and of variations in the reflection or transmission coefficients in the radiation path. In order to also ensure that, in the case of poor reflection or transmission coefficients, an amount of radiation is obtained on the detectors which is sufficient for the required accuracy, the radiation source should be set to a maximum radiation power. This may lead to a reduction of the life of the radiation source, especially if this source is a semiconductor diode laser. Furthermore, a drift-free analog divider is a comparatively expensive element.

The afore-mentioned drawbacks can be avoided, in accordance with a preferred embodiment of the detection system in accordance with the invention, by using the sum signal $S_t$ for controlling the intensity of the radiation source so that the total radiation intensity which is incident on the detectors $D_1$ and $D_2$ remains constant. If the radiation source is a radiation-emitting diode the magnitude of the electric current with which said radiation source is driven may then be corrected for this purpose.

A semiconductor diode laser, for example an AlGaAs laser, is preferably operated with current pulses, because this is most favourable for the life of such a laser. Moreover, the angle at which such a laser emits its radiation can vary when the magnitude of the electric current through the laser is varied. The intensity of the radiation which is emitted by a diode laser is suitably corrected by varying the pulse repetition rate of the electric current pulses at constant pulse width.

As is shown in FIG. 4, the signals from the detectors $D_1$ and $D_2$ are applied to a subtractor circuit 12, at whose output the signals $S_d$ appears, and to an adder circuit 13, at whose output a signal $S_t$ is available. The signal $S_t$ may for example be applied to an input of a differential amplifier $A_d$, whose other input is connected to a reference source Ref. The output of the differential amplifier is connected to an oscillator VCO, which supplies a train of pulses whose frequency is determined by the voltage on its input. The output of the oscillator is connected to a pulse generator PG. The electric current required for the operation of the diode laser $D_l$ is supplied by the pulse generator in the form of pulses of constant duration and with a repetition rate which is equal to that of the pulses from the oscillator VCO.

The average radiation intensity of the diode laser could also be controlled by adapting the duration of the electric current pulses, instead of adapting the pulse repetition rate.

The setting of the diode laser is such that for the maximum radiation loss to be anticipated in the radiation path the total amount of radiation incident on the detectors just suffices to attain the required accuracy, which is inter alia determined by the leakage current and the noise of the detectors. In the case of smaller radiation losses the radiation source emits a smaller radiation intensity, which is favourable for the life of the source.

We claim:

1. An apparatus for writing patterns in a layer of a substrate by means of a charged particle beam, said apparatus comprising:
   a. a source for producing a charged particle beam along a beam axis;
   b. means for moving the substrate relative to the beam axis;
   c. an electrical lense for focusing the charged particle beam onto the layer;
   d. deflection means for deflecting the charged particle beam to predetermined positions on the substrate;
   e. an optical system including:
      1. a radiation source for producing an optical beam;
      2. first optical means for focusing the optical beam into a spot on the surface of the substrate; and
      3. second optical means for forming an image of the spot in a plane of the optical system; and
   f. detection means for detecting the position in said plane at which the image is formed, and for producing a signal representative of a lateral positional error of the image caused by a deviation between the actual and a desired distance of the deflection means from the substrate surface, said signal being utilizable by the deflection means for automatically adjusting the deflection angle of the charged particle beam to prevent lateral positional errors of said charged particle beam.

2. An apparatus as in claim 1 wherein the detection means comprises a lateral-effect photodiode.

3. An apparatus as in claim 1 wherein the radiation source is a laser.

4. An apparatus as in claim 3 wherein the laser is a semiconductor diode laser.

5. An apparatus as in claim 1 wherein the detection means comprises two radiation-sensitive detectors, the outputs of said detectors being connected to a summing circuit whose output is connected to a control circuit for correcting the intensity of the radiation source, in such a way that the sum of the detector signals remains constant.

6. An apparatus as in claim 5 wherein the radiation source is a semiconductor diode laser which emits radiation pulses, and where the control circuit comprises an oscillator which is controlled by the output of the summing circuit, the output of said oscillator being connected to a pulse generator which controls the diode laser.

7. An apparatus as in claim 1, 2, 3, 4, 5 or 6 wherein a beam-inverting element is included in the path of the optical beam which has been reflected a first time by the substrate surface said element reflecting the beam along itself so that it is reflected a second time by the substrate surface before forming the detected image.

* * * * *